USO10064289B2

(12) United States Patent
Rieg et al.

(10) Patent No.: US 10,064,289 B2
(45) Date of Patent: Aug. 28, 2018

(54) HIGH SPEED SOLDER DEPOSITION AND REFLOW FOR A PRINTED FLEXIBLE ELECTRONIC MEDIUM

(71) Applicant: CCL Label, Inc., Framingham, MA (US)

(72) Inventors: Jamie Rieg, Laurens, SC (US); Randal Taylor, Clinton, SC (US); Willie Fowlkes, Greenville, SC (US); John Walsh, Medina, SC (US); Paul Janousek, Simpsonville, SC (US)

(73) Assignee: CCL Label, Inc., Framingham, MA (US)

(*) Notice: Subject to any disclaimer, the term of this patent is extended or adjusted under 35 U.S.C. 154(b) by 0 days.

(21) Appl. No.: 15/497,309

(22) Filed: Apr. 26, 2017

(65) Prior Publication Data
US 2017/0311454 A1 Oct. 26, 2017

Related U.S. Application Data

(60) Provisional application No. 62/327,681, filed on Apr. 26, 2016, provisional application No. 62/434,111, filed on Dec. 14, 2016.

(51) Int. Cl.
F27B 9/06 (2006.01)
H05K 1/11 (2006.01)
A21B 1/22 (2006.01)
H05K 3/34 (2006.01)
H05K 1/02 (2006.01)
(Continued)

(52) U.S. Cl.
CPC ........... *H05K 3/3494* (2013.01); *H05K 1/028* (2013.01); *H05K 3/3484* (2013.01); *H05K 13/0465* (2013.01); *H05K 1/0393* (2013.01); *H05K 2203/1545* (2013.01)

(58) Field of Classification Search
CPC .. H05K 3/3494; H05K 1/028; H05K 13/0465; H05K 1/0393; H05K 3/3484; H05K 2203/1545
USPC .......................... 219/388, 395, 400; 174/263
See application file for complete search history.

(56) References Cited

U.S. PATENT DOCUMENTS 4,600,137 A * 7/1986 Comerford ............ B23K 1/085
228/102
4,771,929 A * 9/1988 Bahr .................... B23K 1/0053
219/85.13
(Continued)

*Primary Examiner* — Sherman Ng
(74) *Attorney, Agent, or Firm* — McDonald Hopkins LLC

(57) ABSTRACT

The present disclosure related to a flexible electronic substrate assembly and a method and system of processing solder paste onto an electrical substrate. The assembly includes a flexible substrate having a solderable medium provided along the flexible substrate. A pattern of solder paste may be cured to a portion of the solderable medium. The solderable medium may be a generally continuous construction or a patterned construction relative to the flexible substrate. The substrate may be unwound from a roll of substrate material before solder paste is deposited thereon. The flexible electric substrate assembly may be formed though a roll to roll process. Infrared heat may be applied to the substrate with the solder paste deposit as the substrate is traveling along the process direction to reflow the solder paste as the substrate is traveling along the process direction at a high rate of speed.

9 Claims, 15 Drawing Sheets

(51) Int. Cl.
*H05K 13/04* (2006.01)
*H05K 1/03* (2006.01)

(56) References Cited

U.S. PATENT DOCUMENTS

| | | | | |
|---|---|---|---|---|
| 4,978,836 A | * | 12/1990 | Dieudonne | B65G 21/10 198/626.5 |
| 5,128,506 A | * | 7/1992 | Dahne | B23K 1/0053 219/85.13 |
| 5,193,735 A | * | 3/1993 | Knight | B23K 1/008 219/388 |
| 5,288,526 A | * | 2/1994 | Hogan | B05D 3/0209 118/58 |
| 5,345,061 A | * | 9/1994 | Chanasyk | B23K 1/008 219/388 |
| 5,593,499 A | * | 1/1997 | Stans | C23C 2/20 118/63 |
| 6,768,083 B2 | * | 7/2004 | Rae | B23K 1/0053 219/388 |
| 2007/0281099 A1 | | 12/2007 | Howarth | |
| 2009/0014503 A1 | | 1/2009 | Choi | |
| 2016/0107253 A1 | | 4/2016 | Kuhn | |

* cited by examiner

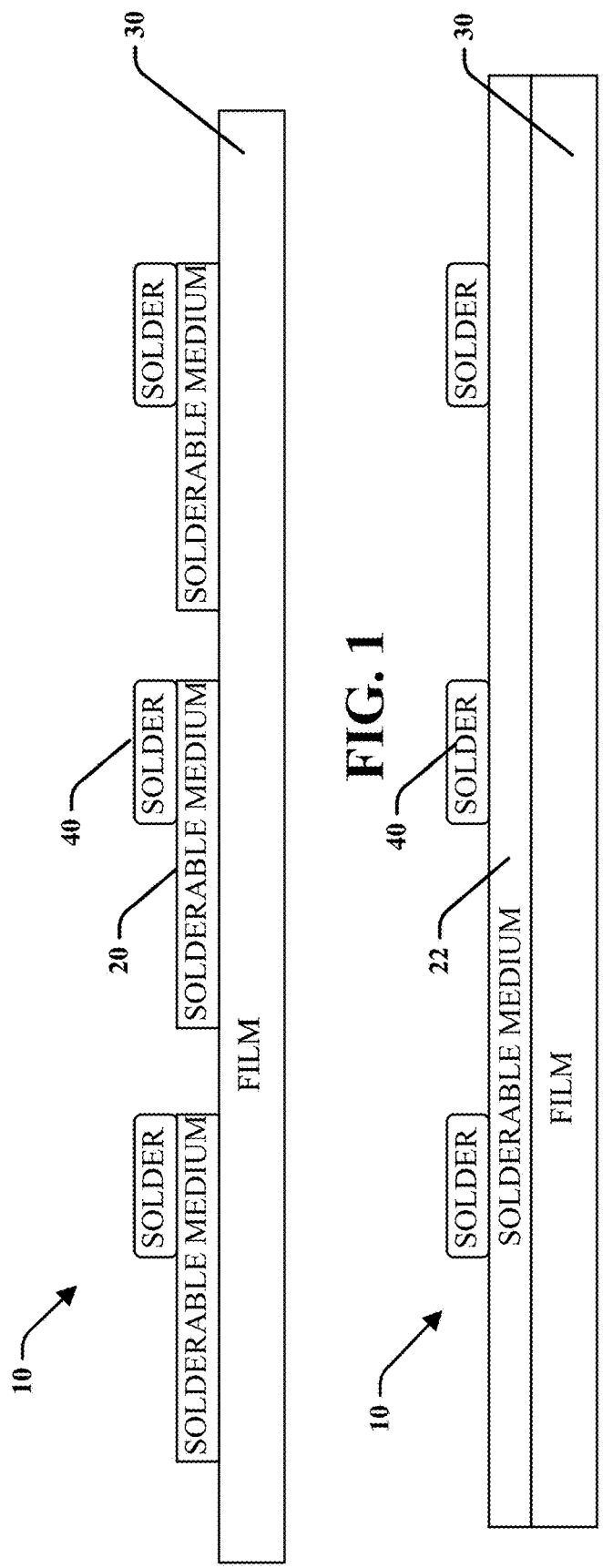

Rotary Screen

Dispensing Valve

US 10,064,289 B2

1

HIGH SPEED SOLDER DEPOSITION AND REFLOW FOR A PRINTED FLEXIBLE ELECTRONIC MEDIUM

CROSS-REFERENCE TO RELATED APPLICATION

This application claims priority to U.S. Provisional Application No. 62/327,681 filed on Apr. 26, 2016 and U.S. Provisional Application No. 62/434,111 filed on Dec. 14, 2016, each of which is hereby incorporated by reference in their entireties.

FIELD OF THE INVENTION

The present disclosure relates to a system and method of depositing solder paste along a flexible electronic substrate for use with electronic devices. More specifically, the present disclosure relates to a printed flexible substrate construction along with a system and method for providing a deposition of a solder paste onto a substrate at a high rate of speed. The system, method and printed flexible substrate may provide a conductive, solderable medium able to provide a flexible, conductive bond for use in various products, including, for example, electronics, hybrid electronic connections and electronic devices.

BACKGROUND

Electronic devices have been assembled to be lightweight and compact. The operation, integration, and complication of chips in electronic devices has increased over the years while the size of electronic devices or components used are getting thinner and smaller, and the pitch of soldering spots is also being reduced. These developments exacerbate an existing problem of solder spattering that occurs in solder reflow processes such that spattered solder often leads to undesired bridging and contamination due to the shortening pitch or distance between solders.

Generally, printed flexible electronics have been used in assembled electronic devices. Known printed flexible electronics have long relied on conductive adhesives such as solder and isotropic conductive adhesives (ICA) to form connections between conductive components or constructions. ICAs may be made with silver, copper, gold, or carbon and include a binder chemistry that includes epoxy, polyimide, or silicone, which are non-conductive. ICAs are typically utilized in processing because they include lower processing temperatures and higher print resolution. However, ICAs display performance limitations such as higher resistance, resistance gain with time, adhesion loss at high temperatures, joint cracking due to thermal expansion coefficient mismatch, and moisture absorption. Additionally, ICAs may be applied to electronic substrates and cured in a variety of mechanisms. In particular, ICAs may be snap cured, heat cured, room temperature cured, B-stage and two-component processed. These cure mechanisms may require that the electronic substrates to receive the ICA be in contact before the curing process.

Similarly, known solder reflow processes also may require that the electronic substrates be in contact with the solder before the curing process. In a conventional solder reflow process, a substrate or carrier is first prepared to receive electrical components. Then, at least one object to be soldered is placed on the carrier in which the object is positioned on the carrier through an application such as printing, dispensing, pick-and-place, plating, or other methods of application. A component to be joined is positioned on the solderable object or alternatively, a component that carries at least a solderable object is placed on the substrate. Afterwards, the substrate may be moved into a high-temperature reflow oven for carrying out a reflow process so as to have the solderable object heated and melted to bond to the substrate.

The conventional reflow process may include a preheating zone, a soaking zone, a reflow zone, and a cooling zone, which may be utilized on surfaces such as individual printed circuit boards or chips. Solder spattering may occur in different zones due to the use of different types of solder. Further, the solder reflow process may take additional time to allow the solder paste to properly cure, as the current state of this technology requires a particular dwell time before substantial curing may occur. In particular, current surface mount technology for a conventional reflow process may be relatively slow from the application to the curing time.

Disclosed are embodiments of an assembly, system, and method that may assist with solving the problems that exist in the prior art. The disclosed assembly, system, and method may improve the processing speed related to applying solder to a substrate and improve the deficiencies with ICAs for use in the electronics industry.

SUMMARY

The embodiments of the present disclosure described below are not intended to be exhaustive or to limit the invention to the precise forms disclosed in the following detailed description. Rather, the embodiments are chosen and described so that others skilled in the art may appreciate and understand the principles and practices of the present invention.

The present disclosure provides a method of processing solder paste onto an electrical substrate. The method comprises depositing solder paste onto an electronic substrate to form a solder paste deposit in a predetermined pattern as the substrate is traveling along a process direction. Infrared heat may be applied to the substrate with the solder paste deposit as the substrate is traveling along the process direction to reflow the solder paste. The solder paste may be dried with convection heat as the substrate is traveling along the process direction. The substrate may be cooled to cure the solder paste in the predetermined pattern as the substrate is traveling along the process direction.

In one embodiment, the infrared heat may be applied within a first zone of an oven. The step of applying infrared heat to the substrate may further comprise applying convective heat to the substrate with the solder paste deposit. The solder paste may be dried in a second zone of the oven wherein the temperature within the second zone is independently controlled from the temperature within the first zone of the oven. The substrate may travel along the process direction at a speed that is greater than about 30 fpm (9.14 mpm), at a speed that is greater than about 50 fpm (15.24 mpm), at a speed that is greater than about 75 fpm (22.86 mpm) up to about 100 fpm (30.48 mpm), at a speed that is greater than about 100 fpm up to about 300 fpm (91.44 mpm) and in particular a speed that is greater than about 150 fpm (45.72 mpm) up to about 175 fpm (53.34 mpm). In particular, the substrate may travel along the process direction at a speed between about 30 fpm and 100 fpm.

The present disclosure also includes a system for processing solder paste onto an electrical substrate. The system comprises a solder paste application station for applying solder paste to an electronic substrate to form a solder paste deposit in a predetermined pattern as the substrate is traveling along a process direction. An oven may be configured to apply infrared heat to the substrate with the solder paste deposit as the substrate is traveling along the process direction to reflow the solder paste and to dry the solder paste with convection. The substrate may be traveling along the process direction at a speed that is greater than 30 fpm (9.14 mpm).

The oven may include a first zone and a second zone such that the temperature within the first zone may be independently controlled from the temperature within the second zone. In embodiments of the disclosed system, the oven may be configured to run with any number of zones from one to over 50 and generate favorable results. The oven may include infrared heaters to applied infrared heat within the first zone of an oven. The oven may apply infrared heat and convective heat to the substrate within the first zone. The solder paste may be dried in the second zone of the oven as convective heat is applied within the second zone of the oven. The substrate may travel along the process direction at a speed that is greater than about 30 fpm (9.14 mpm), at a speed that is greater than about 50 fpm (15.24 mpm), at a speed that is greater than about 75 fpm (22.86 mpm) up to about 100 fpm (30.48 mpm), at a speed that is greater than about 100 fpm up to about 300 fpm (91.44 mpm) and in particular a speed that is greater than about 150 fpm (45.72 mpm) up to about 175 fpm (53.34 mpm).

The present disclosure is also related to a flexible electronic substrate assembly. The assembly includes a flexible substrate having a solderable medium provided along the flexible substrate. A pattern of solder paste may be cured to a portion of the solderable medium. The solderable medium may be a generally continuous construction relative to the flexible substrate. Alternatively, the solderable medium may be a patterned construction relative to the flexible substrate. The substrate may be unwound from a roll of substrate material before solder paste is deposited thereon. The flexible electric substrate assembly may be formed though a roll to roll process.

The solderable medium may include a thickness between about 0.05 microns (0.00197 mil) to about 3 microns (0.118 mil). Additionally, the solderable medium may include a thickness between about 0.15 microns (0.0059 mil) to about 0.3 microns (0.0118 mil). The flexible substrate may include a thickness between about 0.5 mil (12.7 microns) to about 2 mils (50.8 microns). Additionally, the flexible substrate may include a thickness between about 0.8 mil (20.3 microns) to about 1.2 mil (30.5 microns). The flexible electronic substrate assembly may include a total thickness between about 0.5 mil (12.7 microns) to about 10 mils (254 microns). Additionally, the flexible electronic substrate assembly may include a total thickness between about 1.4 mils (35.6 microns) to about 5 mils (127 microns). At least one printed trace may be provided along the surface of the flexible substrate. At least one secondary electric device may be attached to the solder paste along the solderable medium.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

These, as well as other objects and advantages of this invention, will be more completely understood and appreciated by referring to the following more detailed description of the embodiments of the invention in conjunction with the accompanying drawings, of which:

FIG. 1 illustrates a schematic cross sectional view of a solderable medium with a patterned configuration along a substrate according to an embodiment of the present disclosure;

FIG. 2 illustrates a schematic cross sectional view of a solderable medium with a continuous configuration along a substrate according to an embodiment of the present disclosure;

DETAILED DESCRIPTION

Figure 4:
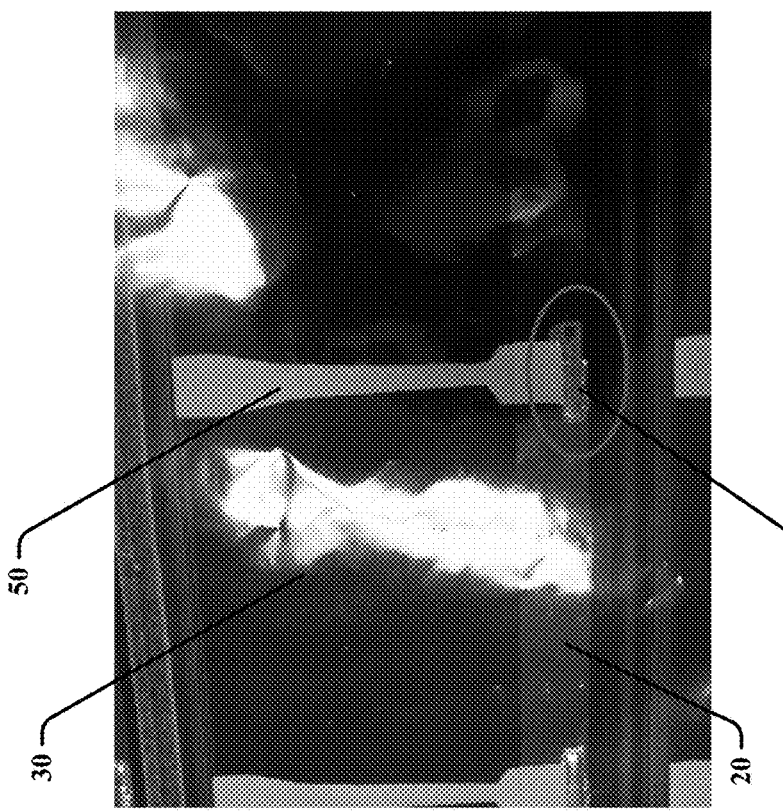
FIG. 4 shows a picture of solder paste position along an embodiment of the substrate in accordance with an aspect of the current disclosure.

Reference will now be made in detail to exemplary embodiments of the present teachings, examples of which are illustrated in the accompanying drawings. It is to be understood that other embodiments may be utilized and structural and functional changes may be made without departing from the respective scope of the present teachings. Moreover, features of the various embodiments may be combined or altered without departing from the scope of the present teachings. As such, the following description is presented by way of illustration only and should not limit in any way the various alternatives and modifications that may be made to the illustrated embodiments and still be within the spirit and scope of the present teachings.

The assemblies and methods disclosed in this document are described in detail by way of examples and with reference to the figures. Unless otherwise specified, like numbers in the figures indicate references to the same, similar, or corresponding elements throughout the figures. It will be appreciated that modifications to disclosed and described examples, arrangements, configurations, components, elements, apparatuses, methods, materials, etc. can be made and may be desired for a specific application. In this disclosure, any identification of specific shapes, materials, techniques, arrangements, etc., are either related to a specific example presented or are merely a general description of such a shape, material, technique, arrangement, etc. Identifications of specific details or examples are not intended to be, and should not be, construed as mandatory or limiting unless specifically designated as such. Selected examples of assemblies and methods are hereinafter disclosed and described in detail with reference made to the Figures.

As illustrated by FIGS. 1 and 2, the present disclosure relates to a flexible electronic substrate assembly 10 of either a continuous or a patterned deposit of a solderable medium 20, 22 on a flexible substrate 30. FIG. 1 illustrates the assembly 10 with a patterned solderable medium 20 and FIG. 2 illustrates the assembly with a continuous solderable medium 22. The flexible electronic substrate assembly 10 may be adapted to be used with a continuous roll to roll based process for surface mounting technology (SMT) in the electronics industry. A roll to roll based process may allow the substrate to receive various layers as the substrate travels along a process direction at a high rate of speed. The disclosure includes applying or dispensing solder paste onto the substrate. Further, the substrate may also include various arrangements of electronic traces such as a layer of conductive ink. The system and method allow for depositing solder paste onto the moving substrate at a high rate of speed and with improved accuracy relative to other known methods and systems.

The solderable medium 20, 22 may be a conductive material such as a metal foil that may be formed utilizing an additive technique such as vapor deposition, sputtering or use of a nucleating agent in a pattern to which material is subsequently applied. Additionally, the solderable medium 20, 22 may be formed by a subtractive technique such as etching, cold foil, or hot stamping. Some examples of materials that may be uses as the solderable medium 20, 22 include silver, copper, tin, and nickel. However, other materials, metals, or alloys may be used and this disclosure is not limited in this regard. The solderable medium 20, 22 may include one or more layers of one or more conductive metals. The solderable medium 20, 22 may include a thickness that ranges between about 0.05 microns (0.002 mil) to about 3.0 microns (0.118 mil) and may further range between about 0.15 microns (0.006 mil) to about 0.3 microns (0.012 mil). Additionally, the solderable medium 20, 22, may be a printed conductive material wherein such material may include silver, copper, silver and copper, or silver coated copper. The solderable medium 20, 22 as a printed conductive material may include one or more layers of one or more conductive materials and may include a thickness that ranges between about 0.5 mil (12.7 microns) to about 2 mils (50.8 microns) and may further range between about 0.8 mil (20.3 microns) to about 1.2 mils (30.5 microns).

The flexible substrate 30 may be a polymeric film. In particular, the polymeric film may include polyethylene terephthalate (PET), polyethylene naphthalate (PEN), polyimide (PI), or other polymer based materials such as polyethylene (PE), polypropylene (PP) and polyvinyl chloride (PVC). The flexible substrate 30 may be flexible to allow it to be processed in a roll to roll operation. The flexible substrate 30 may include a thickness that ranges between about 0.5 mil to about 10 mils and may further range between about 1.4 mils to about 5 mils. The flexible substrate 30 may include a treatment such as a surface treatment to assist with ink or metal adhesion. This treatment may improve the adhesion to the solderable medium 20, 22. The flexible substrate 30 may include a characteristic that allows it to be dimensionally stable through a range of temperatures and in particular dimensionally stable at high temperatures, such as temperatures in excess of 150° C. The flexible substrate 30 may undergo a treatment or processing step to provide heat stabilization.

In one embodiment, the flexible substrate 30 may include a thickness of about 0.2 micron (0.008 mil) up to about 100 microns (4 mils). In one embodiment, the thickness of the substrate was between about 10 to 90 microns (0.4 mil to 3.5 mils) and more particular about 75 microns (3.0 mils). Additionally, various ranges of substrates thicknesses have been evaluated including substrates that may include a layer of conductive ink 22. This ink may be applied to the substrate prior to the solder paste and before being processed through an oven. This ink 22 may have a thickness between about 0.5 mil (12.7 microns) to about 1.5 mils (38.1 microns) and more particularly about 0.8 mil (20.3 microns) to about 1.2 mils (30.5 microns). The thickness identified represent the conductive ink thickness in a dried state without the substrate. This type of conductive ink may be solderable and may contain silver, silver coated copper, or silver and copper. The ink may be applied to a substrate (such as PET) prior to the solder paste 40 (and the oven). This solderable ink may be alternatively used to metalized copper or other types of electrical traces provided on the substrate.

The solder paste 40 may be applied to the solderable medium 20, 22 to provide a robust conductive bond between conductive materials. The solder paste 40 may be deposited in a variety of configurations and dimensions which may be defined by the application requirement. The solder paste 40 may be a "No Clean" type wherein the application of the solder paste 40 to the solderable medium 20, 22 may not include the use of solvents to remove residue. The solder paste 40 may include metal constituents which may be selected based on the conductive materials to be bonded and other material processing limitations. Solder paste 40 may include two or more materials such as tin, bismuth, silver, indium, or zinc. The solder paste 40 may have a reflow temperature that is less than 200° C. and preferable less than 165° C. In one embodiment, the amount of flux contained in the solder paste 40 may be minimized such as less than 20% by weight. Further, the solder paste may include fast drying solvents or resins. The thickness and dimensions of the solder paste 40 may be defined by the application and process requirements or limitations. Although these features of the solder paste 40 may describe an embodiment of the instant disclosure, it is understood that various types of solder paste 40 may be utilized made of different materials or configurations and this disclosure is not limited in this regard.

Figure 3:
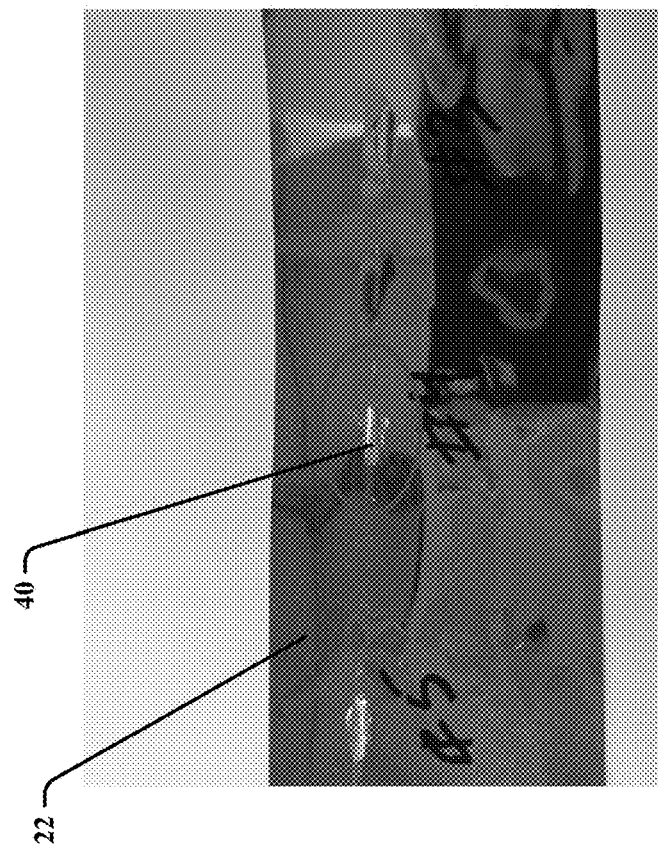
FIG. 3 shows a picture of solder paste positioned along an embodiment of a substrate in accordance with an aspect of the present disclosure.
Figure 6:
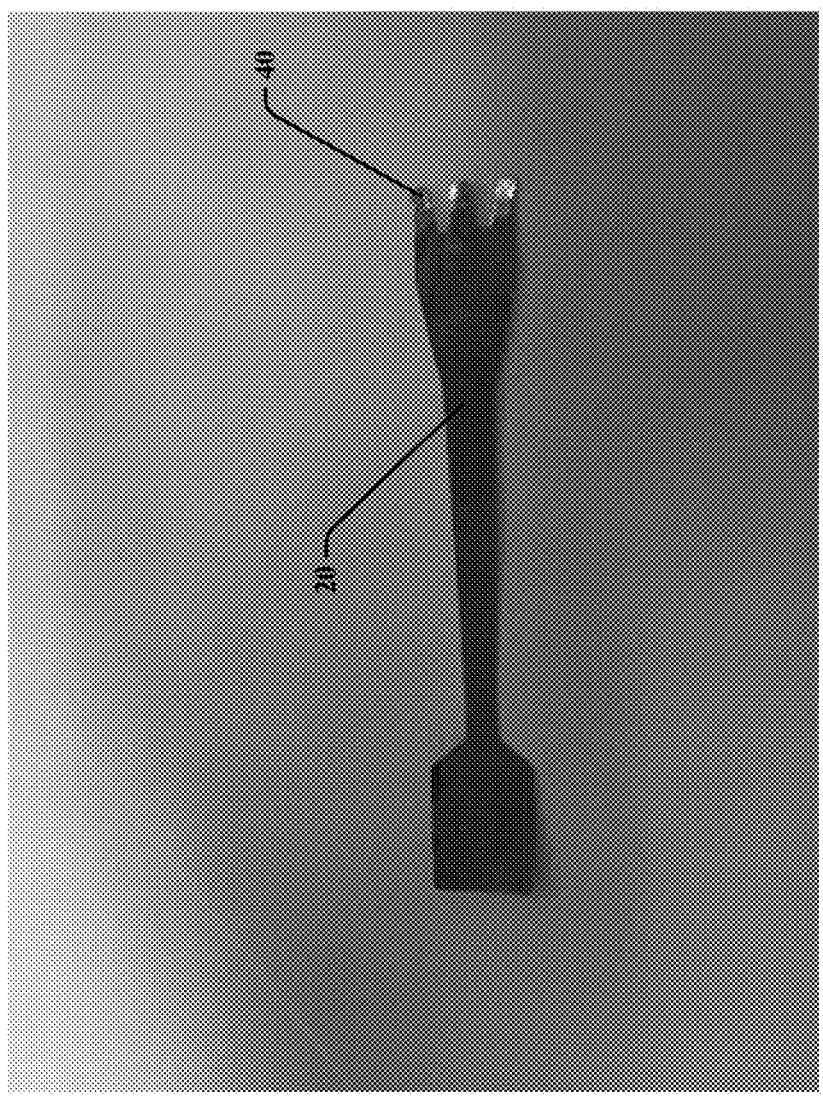
FIG. 6 shows a picture of an embodiment of a patterned solderable medium with solder paste of the present disclosure.
Figure 5:
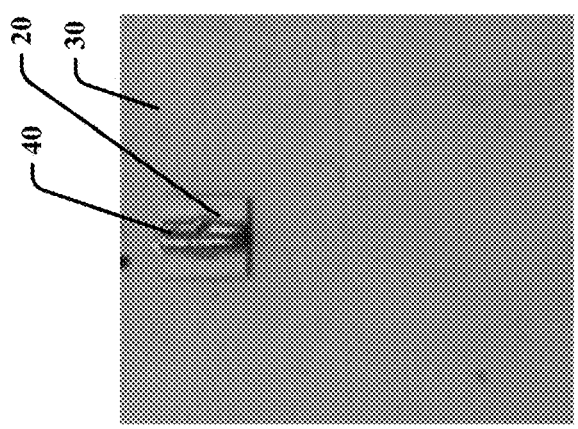
FIG. 5 shows a picture of an embodiment of solder paste on a patterned solderable medium positioned along a substrate.

FIGS. 3-6 illustrate various embodiments of the flexible electronic substrate assembly 10. FIG. 3 shows a picture of an embodiment of the flexible electronic substrate assembly 10 having a plurality of solder paste elements 40 positioned along the continuous solderable medium 22 as it is positioned along the flexible substrate 30. FIG. 4 shows a picture of flexible electronic substrate assembly 10 having a plurality of solder paste elements 40 position along a first patterned solderable medium 20 as it is positioned along a second patterned solderable medium 20 as both are positioned along the flexible substrate 30. FIG. 5 shows a picture of an embodiment of solder paste 40 on a patterned solderable medium 20 positioned along a substrate 30. FIG. 6 shows a picture of an embodiment of the patterned solderable medium 20 with solder paste 40 which was die cut from the flexible substrate of FIG. 4.

Figure 7:
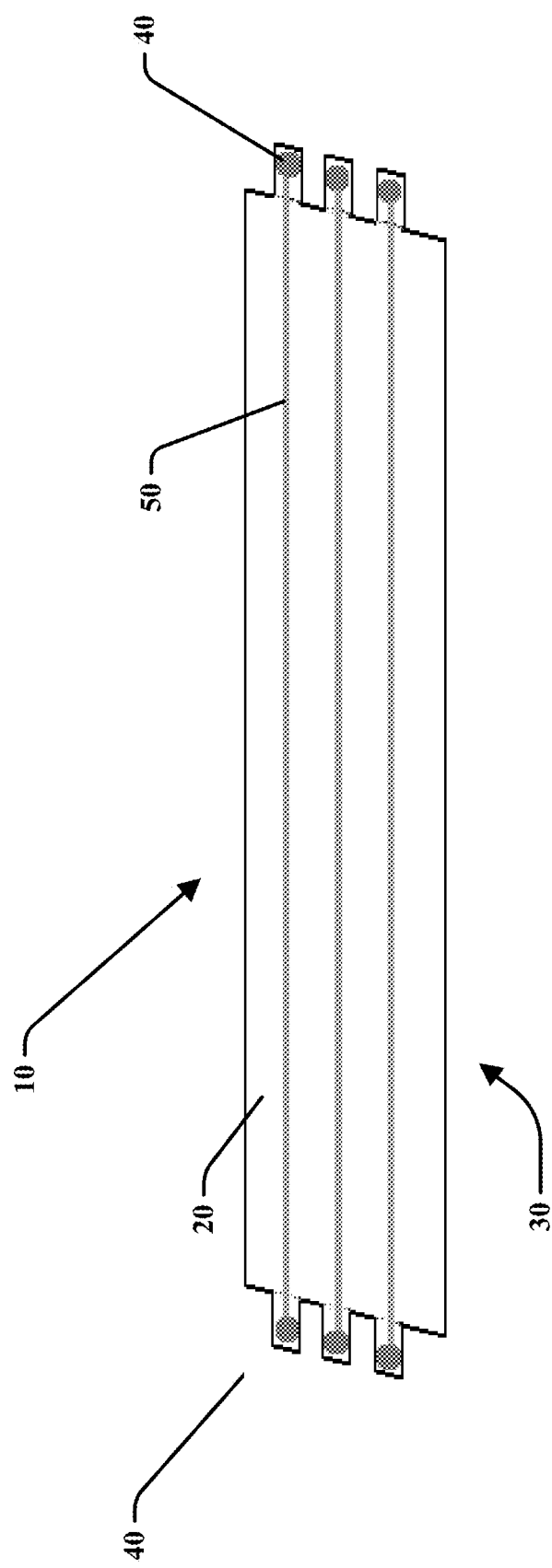
FIG. 7 illustrates a schematic plan view of an embodiment of a patterned solderable medium with solder paste and traces of the present disclosure.

Similarly, FIG. 7 illustrates an embodiment of solderable medium 20 that has been die cut into a particular shape that includes solder paste 40 on edges of the patterned solder medium 20. The solder paste 40 may be in communication with printed traces 50 that extend from the solder paste 40 to solder paste 40 along opposite edges thereon. The flexible electronic substrate assembly 10 may be combined with other electronic devices to allow electronic communication from solder paste 40 through printed traces 50 to solder paste 40. The solder paste 40 and printed traces 50 may incorporate a variety of configurations along the flexible electronic substrate assembly 10 that allow for the assembly to be processed from roll to roll. The printed traces 50 may include a variety of patterns and arrangements.

Figure 8:
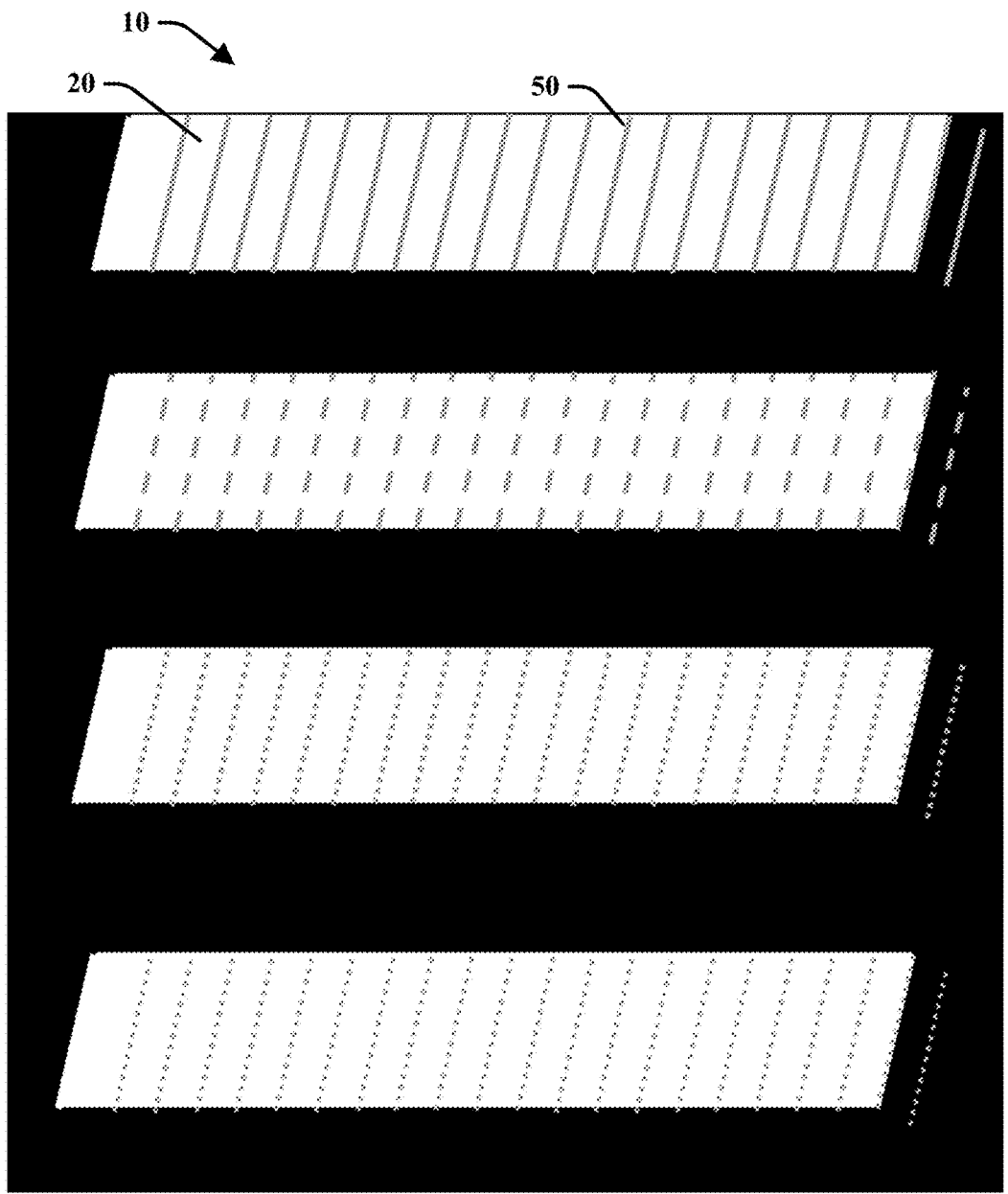
FIG. 8 illustrates schematic plan views of embodiments of patterned applied solder paste of the present disclosure.
Figure 9:
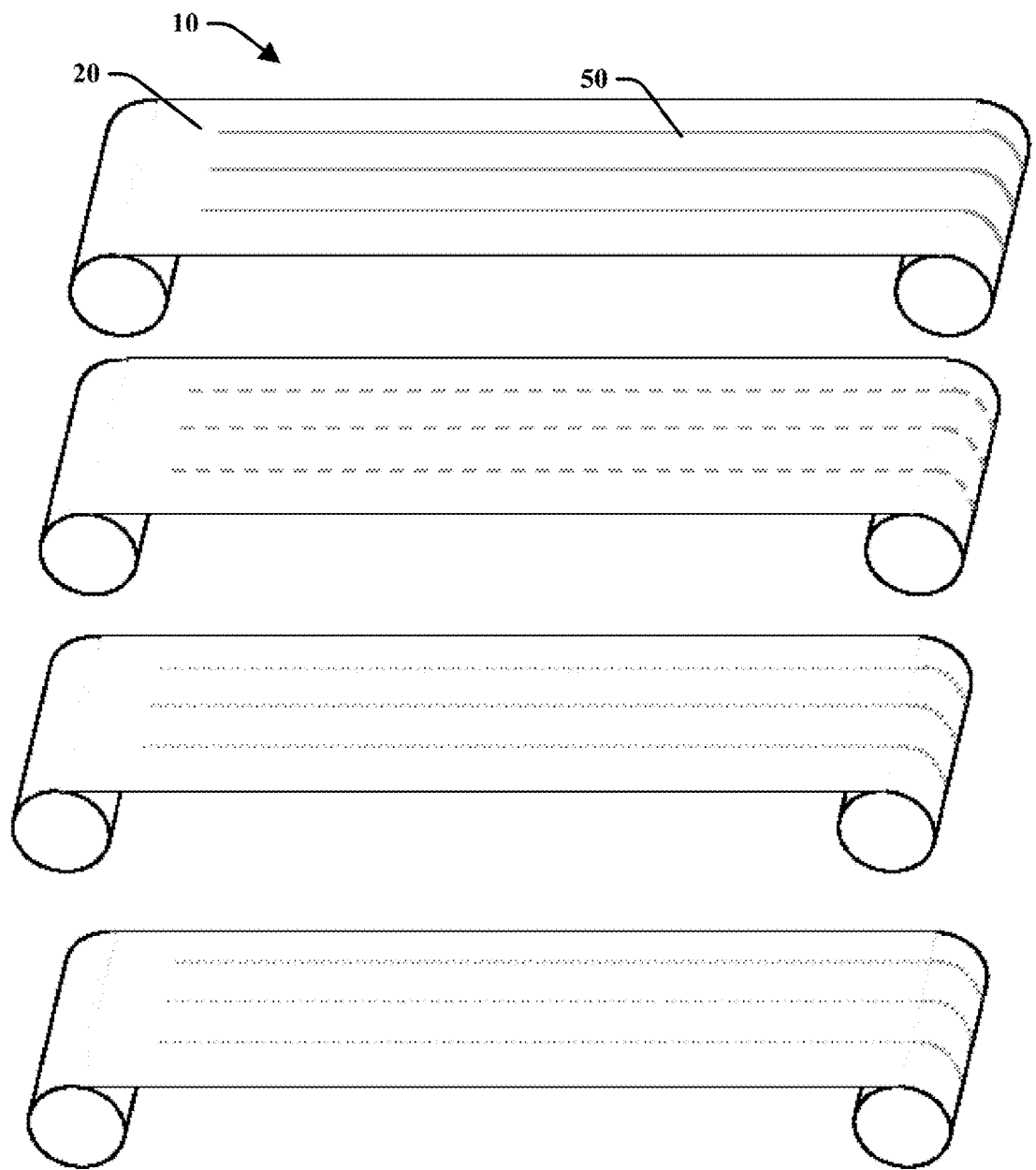
FIG. 9 illustrates schematic plan views of additional embodiments of patterned applied solder paste of the present disclosure.

As illustrated by FIGS. 8, and 9, provided are various embodiments of the flexible electronic substrate assembly 10. In each embodiment, flexible substrates 30 are illustrated in a roll to roll processing configuration. Wherein the solder paste 40 may be applied in various geometries including but not limited to circles, squares, rectangles, lines. Further, the solder paste can be applied in a series of continuous bands or a plurality of segmented bands positioned on the conductive substrate to match the application required positions. The length and width of the bands or segmented bands may be determined by the engineering requirements of the application. Typically, the dimensions of the bands and segmented based would be limited to just the positions requiring conductive bonding given the tolerances of the joining process throughout the continuous roll. This allows the roll with the solder and solderable conductive areas to be wound into a convenient form for subsequent processing. Such a roll can be utilized as a component part to obviate the need to apply solder in a later operation. Such a roll format can be laminated to support structures or used in a flexible form factor as required. The roll can be subsequently sheeted into individual units of use in subsequent processing.

Figure 10:
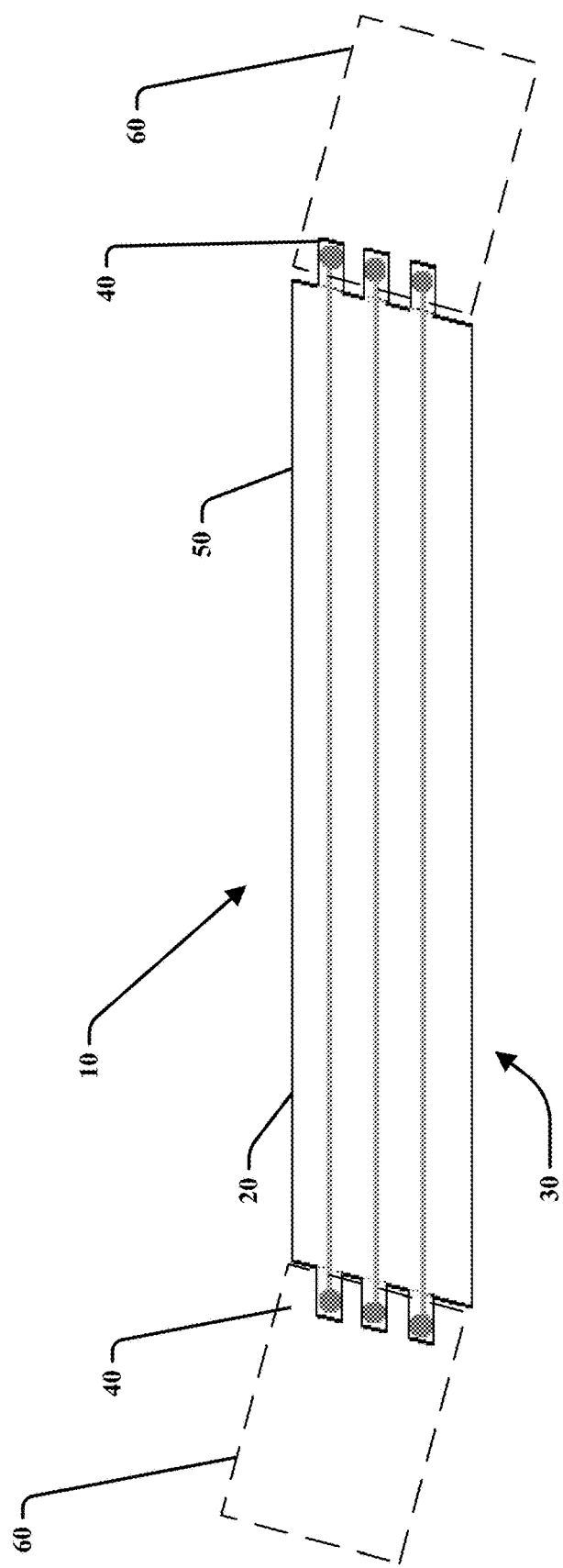
FIG. 10 illustrates a schematic plan view of an embodiment of a patterned solderable medium with solder paste and traces of the present disclosure.

As illustrated by FIG. 10, a secondary electronic device 60 may be adhered to the solder paste 40 before the reflow process. The secondary electronic device 60 may be any electronic element desired to communicate electronically with another electronic device 60 through the flexible electronic substrate assembly 10. This configuration may result in a robust conductive bond. The resultant product may likely require die cutting or sheeting for storage or handling purposes. In one embodiment, the secondary device may be applied in separate processing step. In this case, the substrate 30 and the solderable medium 20, 22 with solder paste 40 may be wound into a roll for storage or shipment prior to being combined with the secondary device 60. The created roll could be processed further to customize the product for an application. A subsequent bond may be created during a second reflow process. The second reflow process would preferably include a fluxing step of the secondary device 60 to the electronic substrate assembly 10. Additionally, a secondary or tertiary device may be a battery such as a coin cell wherein the secondary device is not soldered to the substrate assembly 10 but electrical traces are configured to electrically communicate with the battery.

Figure 11A:
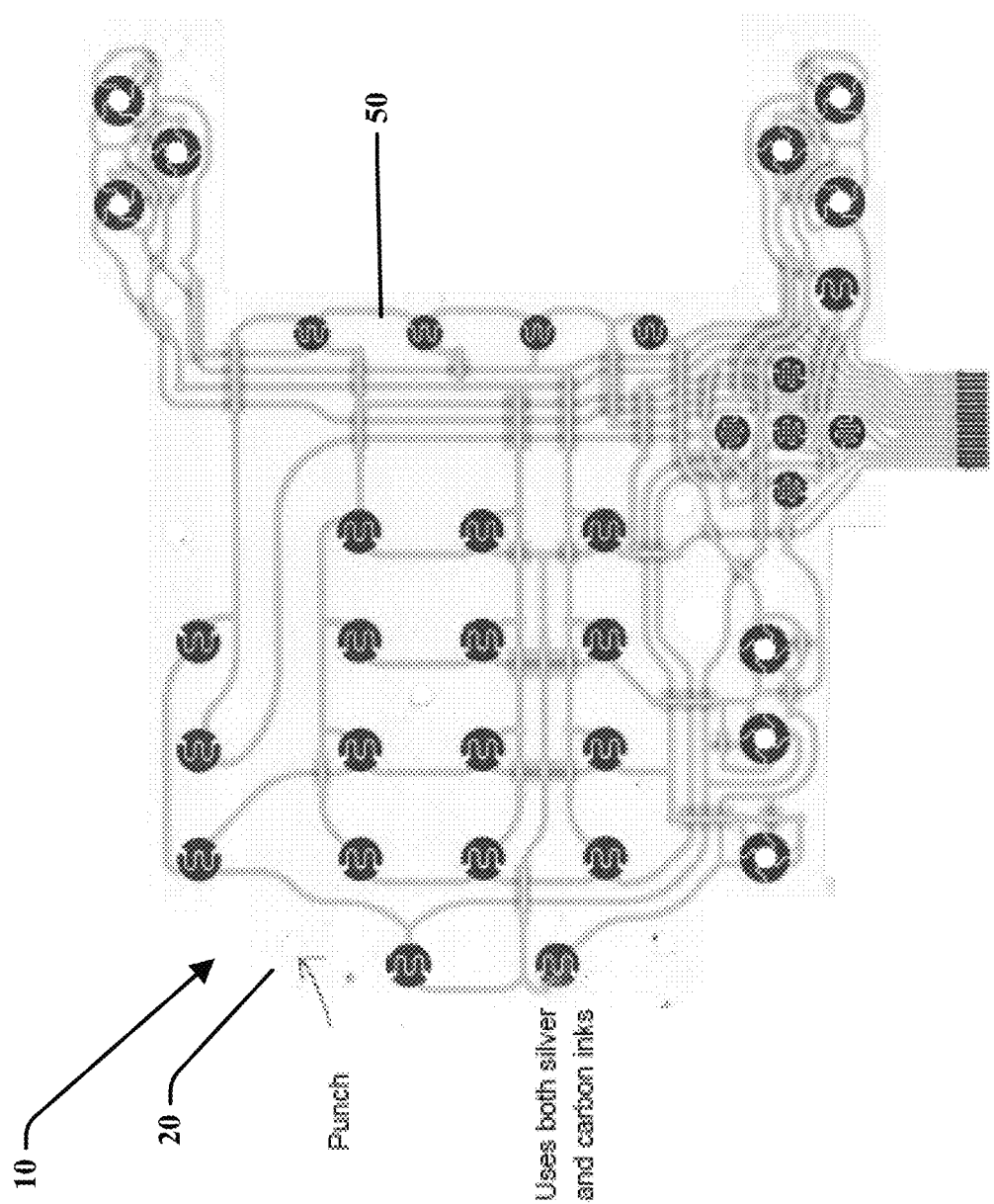
FIG. 11A illustrates a front side of an embodiment of the electronic substrate assembly of the present disclosure.
Figure 11B:
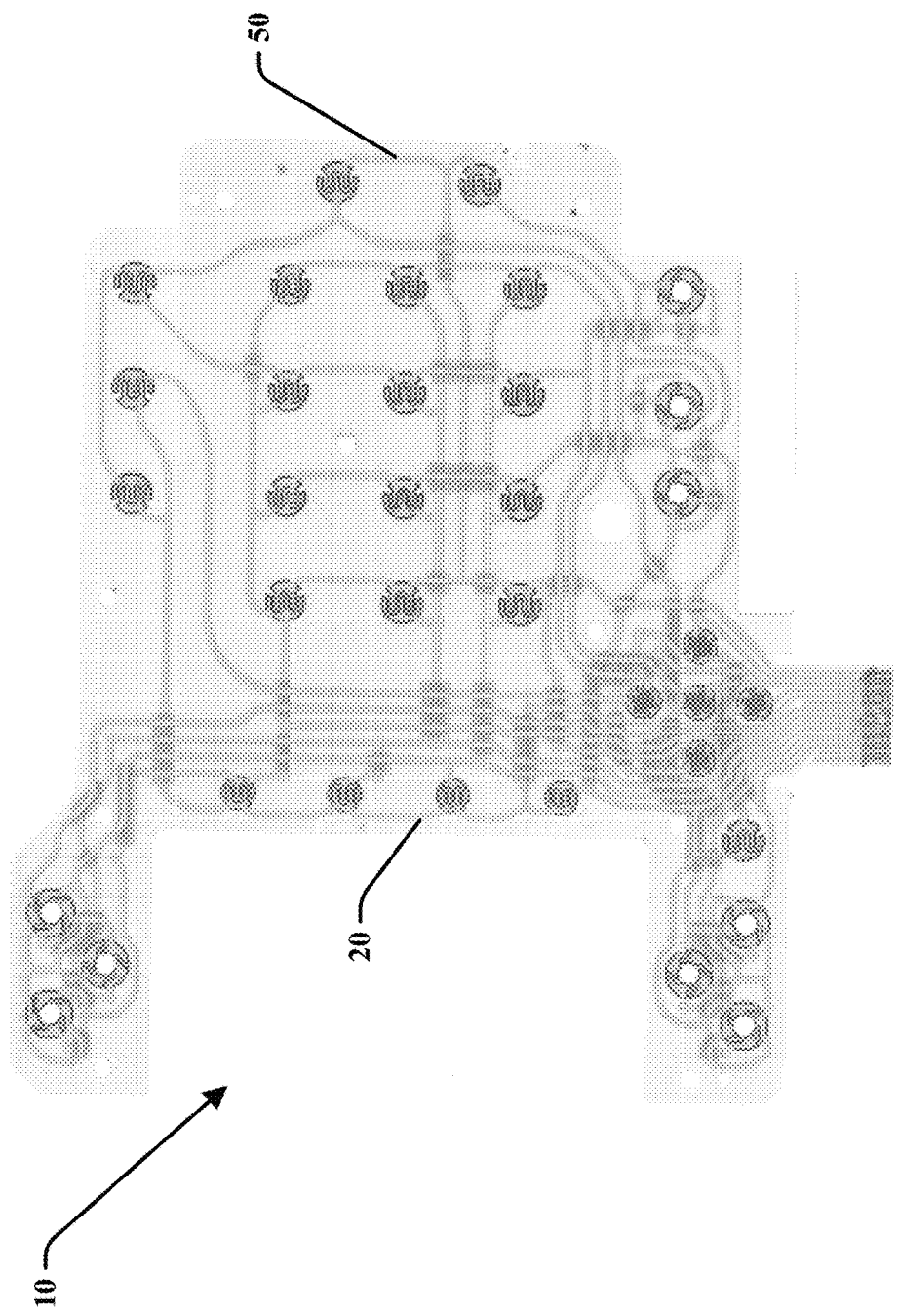
FIG. 11B illustrates a back side of the electronic substrate assembly of FIG. 11A.

FIG. 11A illustrates a front side of an embodiment of the electronic substrate assembly and FIG. 11B illustrates a back side. This embodiment of the substrate assembly 10 utilizes additional processing steps to configure the electronic substrate assembly 10 as desired. For example, additional layers of solder paste 40 or printed traces 50 may be printed or deposited on the substrate 10. Additionally, more than one type of conductive material or inks (such as both silver and carbon type inks) may be applied in various patterns on substrate assembly 10 wherein at least one the conductive materials may be solderable. The substrate assembly may include various die cuts, punches, vias, or slots to arrange the assembly as desired for the final application. As illustrated by FIG. 11B, conductive materials may also be applied along the back side of the substrate assembly 10 in various configurations. This material may or may not be in electrical communication with the front side.

These configurations may be utilized in a variety of electric applications that include printed flexible electronics and flex-rigid electronics. In one embodiment, the electronic substrate assembly 10 may be utilized for making permanent contact between a printed battery and a printed circuit in a sensor. In another embodiment, the electronic substrate assembly 10 may be utilized to provide electrical connections between rigid subassemblies that may replace wiring harnesses in automotive applications.

In particular, known surface mounting technology (SMT) in the electronics industry is only capable of operating at less than about 30 feet per minute (fpm) or about 9 meters per minute (mpm). However, the assembly and method of the instant disclosure is capable of operating at a rate of speed higher than 30 fpm (about 9 mpm). In embodiments, the present system and method provide for depositing solder at a rate of speed of about 50 fpm (about 15 mpm) or greater; about 60 fpm (about 18 mpm) or greater; about 75 fpm (about 23 mpm) or greater; even about 85 fpm (about 26 mpm) or greater. In embodiments, the system and method allow for operation at speeds from about 50 fpm (about 15 mpm) to about 100 fpm (about 30 mpm) from about 60 fpm (about 18 mpm) to about 90 fpm (about 27 mpm); even from about 60 fpm (about 18 mpm) to about 80 fpm (about 24 mpm). In one embodiment, the system and method can operate at speeds from about 75 fpm (about 23 mpm) to about 100 fpm (about 30 mpm). Further, the system and method may operate at speeds from 100 fpm (about 30 mpm) up to about 300 fpm (about 91 mpm) and in particular it may operate at speeds that are greater than about 150 fpm (about 46 mpm) up to about 175 fpm (about 53 mpm).

Figure 12:
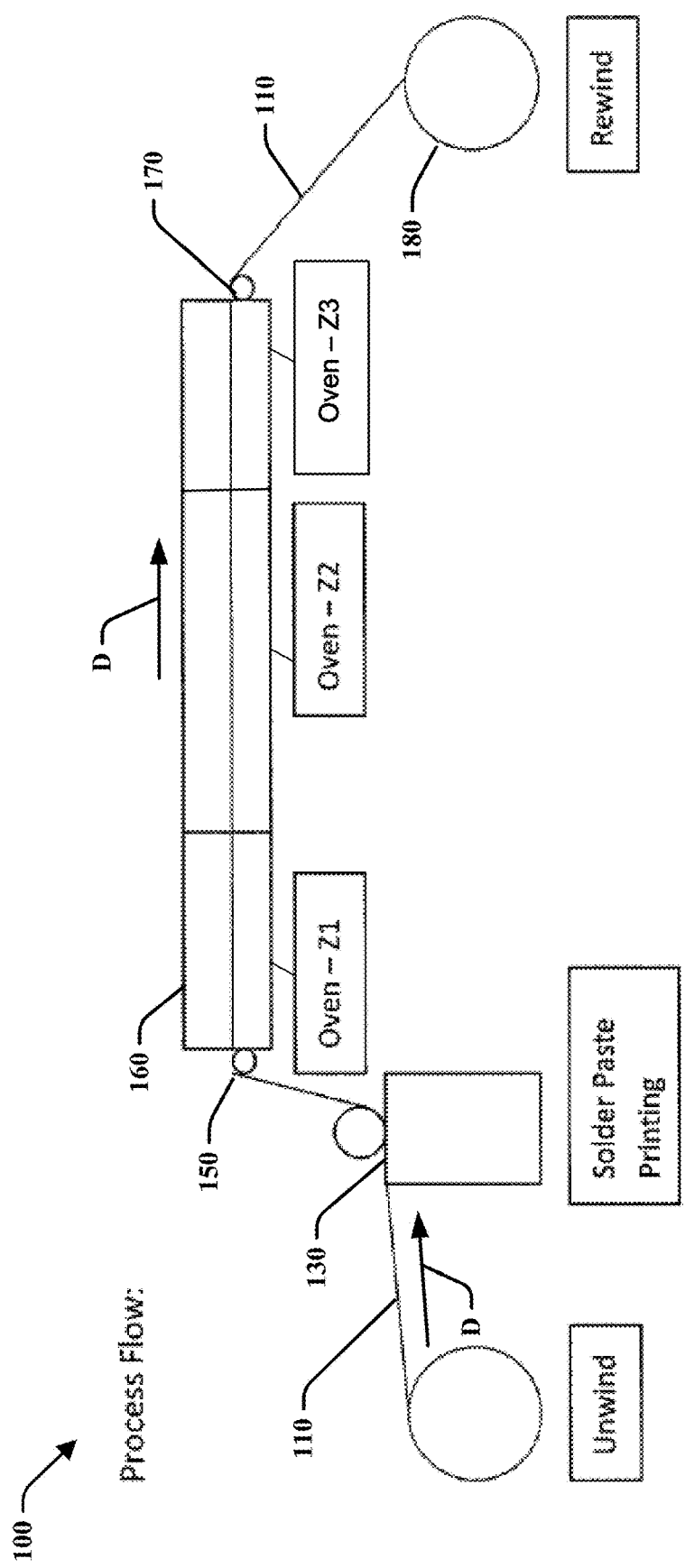
FIG. 12 illustrates a schematic plan view of an operation according to an embodiment of the present disclosure.

FIG. 12 illustrates a schematic view of a system 100. In particular, a substrate material 110 may be introduced at an unwinding station 120. The substrate 110 may be made of a thin metalized material such as copper. The substrate 110 may have various metal traces or contacts thereon and be made of various metal materials or alloys and this disclosure is not limited to any particular materials or substrates.

Additionally, in one embodiment, a substrate 110 may be a foil having thicknesses between about 0.15 micron (0.006 mil) to about 0.30 micron (0.012 mil). However, this disclosure is not limited to the thickness or this particular type of the substrate as various configurations may be utilized without damaging or distorting the substrate 110 or assembly.

Figure 14:
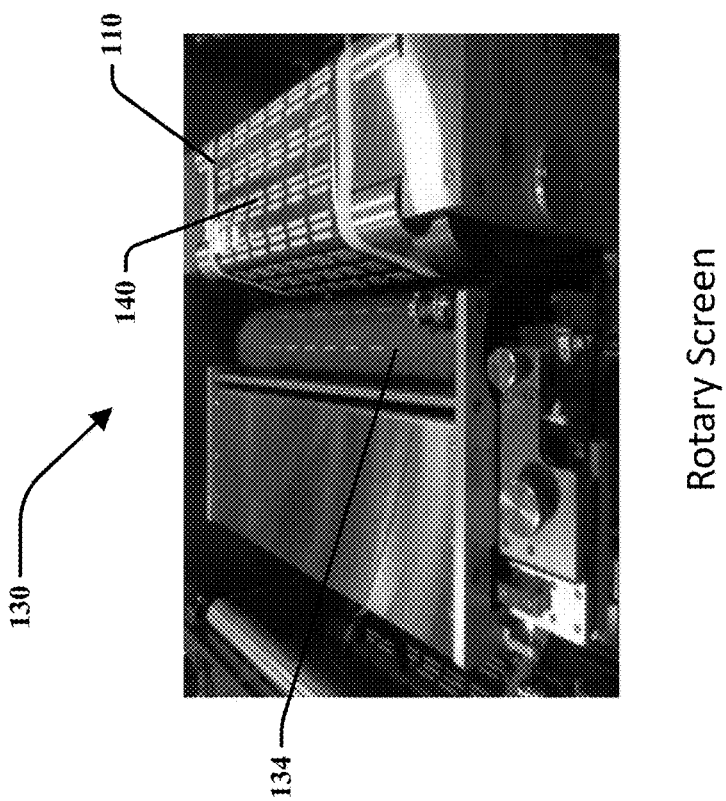
FIG. 14 shows a picture of an embodiment of the solder paste application station of the present disclosure.
Figure 13:
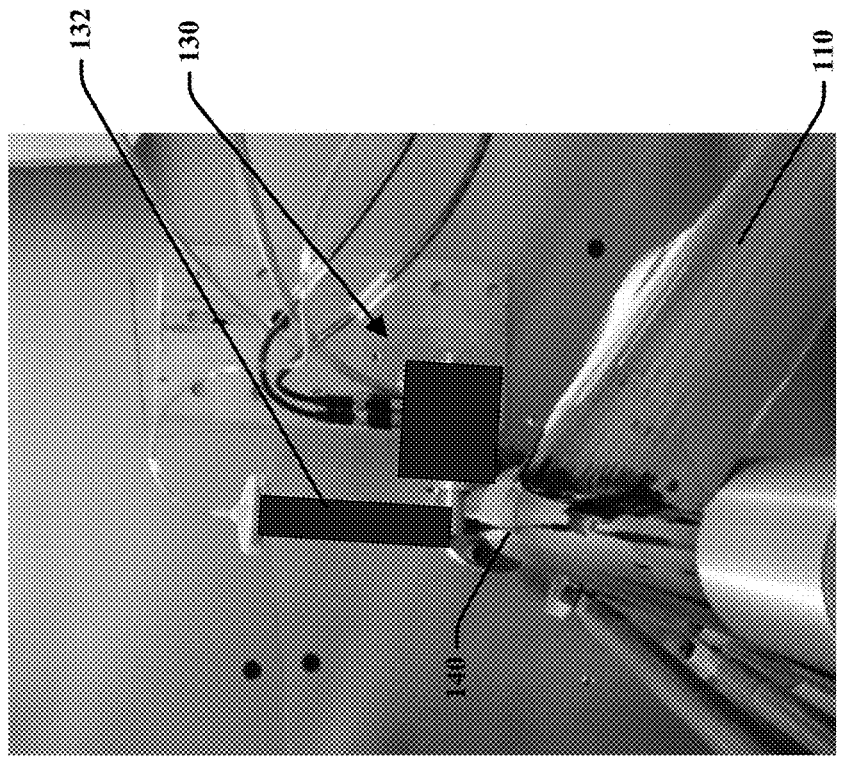
FIG. 13 shows a picture of an embodiment of a solder paste application station of the present disclosure.

The substrate 110 may generally be a continuous substrate material and may initially be provided in roll form. The substrate 110 may be unwound at the unwinding station 120 to travel along a process direction D to a solder paste application station 130. In one embodiment, the solder paste application station 130 may include a dispensing valve 132 as illustrated by FIG. 13. Additionally, it may include a rotary screen 134 as illustrated by FIG. 14. The solder paste application station 130 may apply a solder paste 140 to the substrate 110 at predetermined patterns that may be in electric communication with various trace features present in or on the substrate 110. Additionally, solder paste 140 may be applied to the substrate at the station 130 via stencil, continuous flat bed screen assembly, or a screen print including a rotary screen and a squeegee. The solder paste 140 may be delivered to the substrate 110 by operation of a pump such as a pneumatic displacement pump or the like.

The substrate 110 may then be processed through to the oven 160 to reflow the solder paste and reduce the cure time of the solder paste 140 on the substrate 110. The substrate 110 may extend over an infeed nip 150 before entering the oven 160. The infeed nip 150 may assist to isolate tension to the substrate 110 as it extends through the oven 160 to an outfeed nip 170 along the process direction D. The substrate 110 may subsequently be rewound at a rewind station 180 after the solder paste 140 has been cured thereon.

Figure 16:
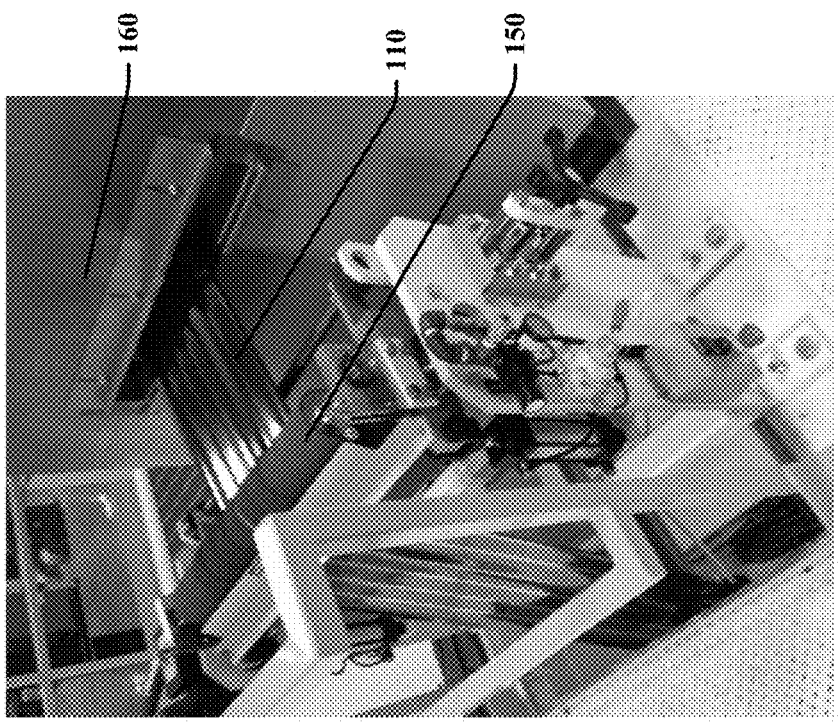
FIG. 16 shows a picture of an embodiment of an infeed nip of the present disclosure.
Figure 15:
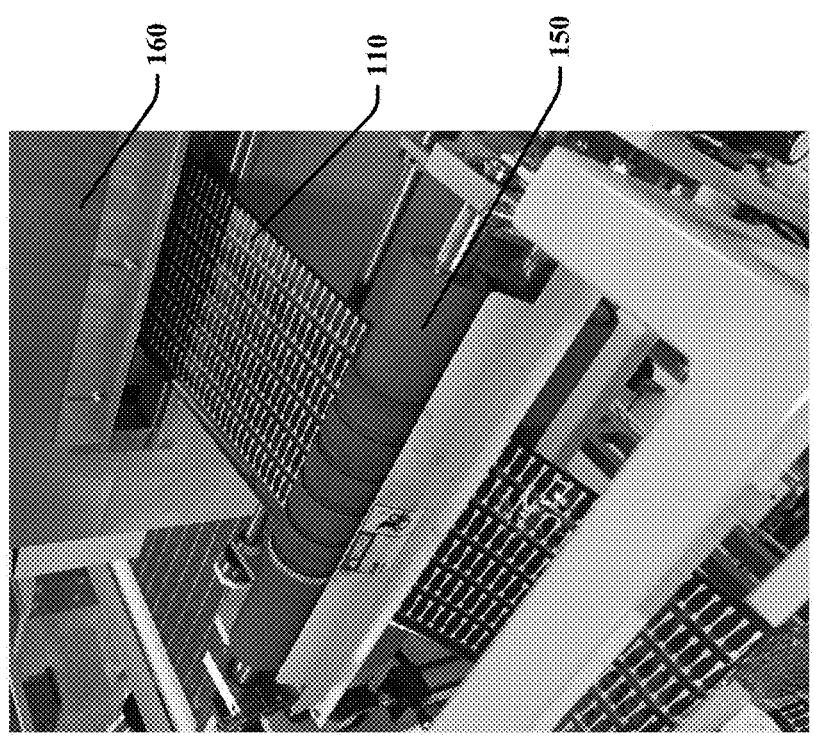
FIG. 15 shows a picture of an embodiment of an infeed nip of the present disclosure.
Figure 17:
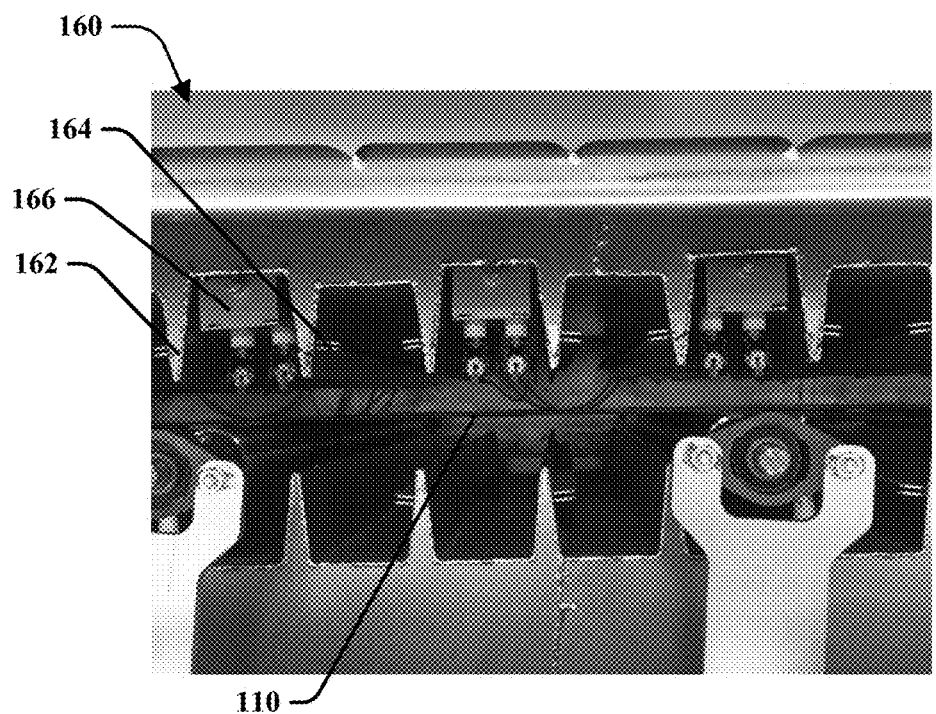
FIG. 17 is a picture of an embodiment of an interior portion of a first zone of an oven of the present disclosure.

The infeed and outfeed nips 150, 170 may allow the substrate 110 to move within the oven 160 while maintaining tension forces thereon. The tension forces allow the substrate 110 to travel though the oven 160 without sagging, distortion or otherwise causing damage to the substrate 110 as it moves therethrough at high rates of processing speeds. FIGS. 15 and 16 illustrate various embodiments of the infeed nip 150 of the present disclosure. In one embodiment, the substrate 110 may be processed in a segmented orientation as arranged along its width. FIG. 17 illustrates an embodiment of the outfeed nip 170.

As illustrated by FIG. 12, the oven 160 may include a first zone Z1 and a second zone Z2 wherein the first and second zones maintain independent temperature control relative to the other. This disclosure is not limited to the number of zones provided. Further, a third zone Z3 may be positioned after the second zone Z2. The first zone Z1, second zone Z2, and third zone Z3 may be configured to allow for independent air velocity and control therein. The first zone Z1 may be able to deliver high heat to reflow the solder paste 140 within a particular time such as within five (5) seconds as the substrate 110 travels along the process direction D. The particular heat applied through the first zone Z1 may include at least one of convection heat and radiant heat wherein the radiant heat may be applied by near, short, or mid wave infrared heaters. Alternatively, electron beam energy may also be used to deliver high heat to reflow the solder paste in lieu of or in addition to, the inferred heaters. In embodiments of the disclosed system, the oven 160 may be configured with any number of zones from one to over 50 that are configured to generate favorable results and this disclosure is non limiting in this regard.

Figure 18:
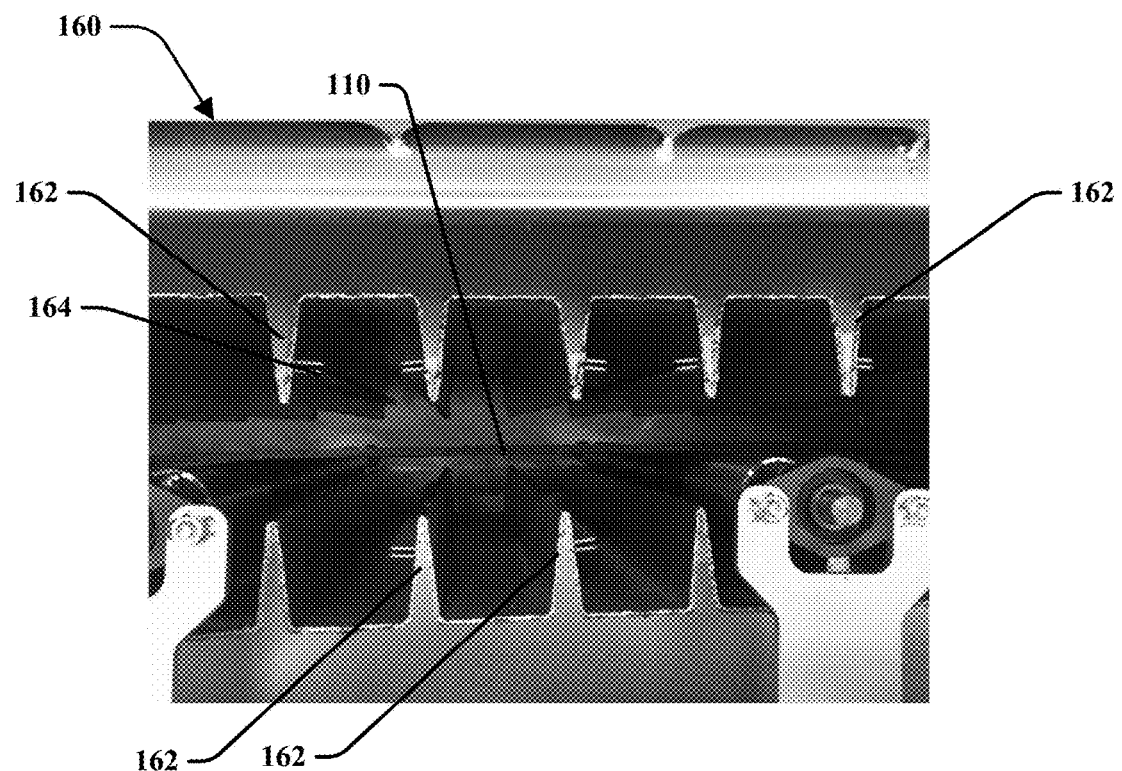
FIG. 18 is a picture of an embodiment of an interior portion of a second zone of an oven of the present disclosure.

FIGS. 17 and 18 illustrate interior portions of the first zone Z1 and second zone Z2 of the oven 160, respectively. Notably, the oven 160 may include air impingement nozzles 162 within the first and second zones Z1, Z2. The impingement nozzles 162 may extend from a top surface and a bottom surface relative to the substrate 110 therein and may include diffusers 164. The diffusers 154 may be removeable and configurable based on the particular type of desired pattern of airflow. The impingement nozzles 162 may assist to control convective heat airflow against the substrate 110 and the solder paste deposited thereon. The nozzles may provide hot air between 340° F. (171° C.) to about 375° F. (191° C.) or up to about 400° F. (204° C.). Further, the oven 160 may include heaters 166 at various locations to provide energy to the substrate. In one embodiment, the heaters are infrared heaters 166 that provide infrared heat energy to the substrate. In another embodiment, the heaters 166 may be an electron beam type heaters. Additionally, other types of energy sources may be utilized herein that are sufficient to reflow the solder.

The heaters 166 may be located between impingement nozzles 162 within the first zone Z1 of the oven 160. The infrared heaters 166 may be dual bulb type to provide short wavelength type IR energy. The infrared heaters 166 may be configured to provide heat between about 1600° F. (871° C.) to 3000° F. (1949° C.) and more particularly could provide up to about 4000° F. (2204° C.). For example, infrared heaters 166 could provide short wavelength type IR energy between about 1292° F. (700° C.) to 3272° F. (1800° C.) while infrared heaters 166 operating in the near infrared condition may provide be configured to provide heat between about 3272° F. (1800° C.) to 6512° F. (3600° C.). There may be infrared heaters provided along a six (6) foot portion along the process direction D and adjacent the initial entrance of the oven 160 at the first zone Z1.

In one embodiment, the infrared heaters 166 may provide energy along a particular length of the substrate 110 (such as 24" or 0.61 m) as it is positioned within the oven 160. In particular, the infrared heaters 166 may be positioned along an entrance of the oven 160 wherein various IR heaters may be provided as needed adjacent the opening of the oven 160. The size and amount of the IR heaters 166 may be provided based on the desired processing speeds of the substrate 110 as it is passed through the oven 160 and exposed to the particular lengths of energy emitted from the IR heaters 166. For example, one IR heater 166 may emit energy along 24" (0.61 m) length of the substrate. If the substrate 110 is being processed along the process direction D at various speeds, the solder paste thereon may be exposed to the emitted IR energy for various times. For speeds of 50 feet per minute (fpm) (15.24 meters per minute—mpm), for example, the substrate 110 may be exposed to a 24" of emitted IR energy from the IR heater 166 for about 2.4 seconds. For speeds of 75 fpm (22.86 mpm), the substrate 110 may be exposed to a 24" of emitted IR energy from the IR heater 166 for about 1.6 seconds. For speeds of 100 fpm (30.48 mpm), the substrate 110 may be exposed to a 24" of emitted IR energy from the IR heater 166 for about 1.2 seconds. For speeds of 150 fpm (45.72 mpm), the substrate 110 may be exposed to a 24" of emitted IR energy from the IR heater 166 for about 0.8 seconds. For speeds of 175 fpm (53.34 mpm), the substrate 110 may be exposed to a 24" of emitted IR energy from the IR heater 166 for about 0.7 seconds. For speeds of 300 fpm (91.44 mpm), the substrate 110 may be exposed to a 24" of emitted IR energy from the IR heater 166 for about 0.4 seconds. However, additional IR heaters 166 may be provided as desired to increase the length of emitted energy exposure along the substrate 110.

Additionally, various process rolls may be provided within the oven to assist with supporting the structural integrity of the substrate 110 as it is translating through the oven 160. In one embodiment, the IR heaters may not be necessary for process speeds below 100 fpm. Additionally, this system may also incorporate various energy sources such as electron beam devices and laser devices in place of the IR heaters. These energy sources may be helpful for reflowing solder at speeds in excess of 100 fpm.

Figure 19:
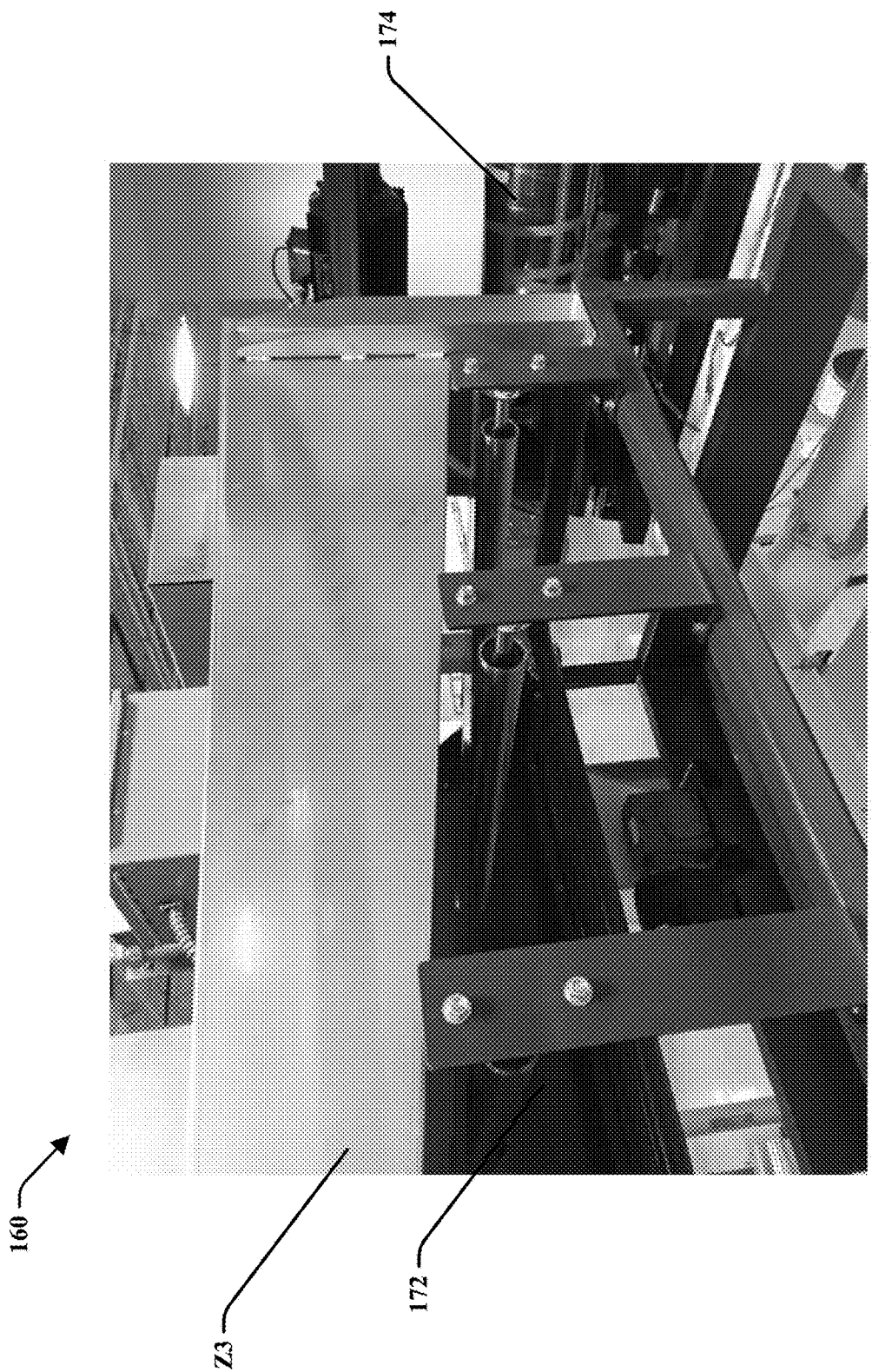
FIG. 19 is a picture of a cooling portion of the oven of the present disclosure.
Figure 20:
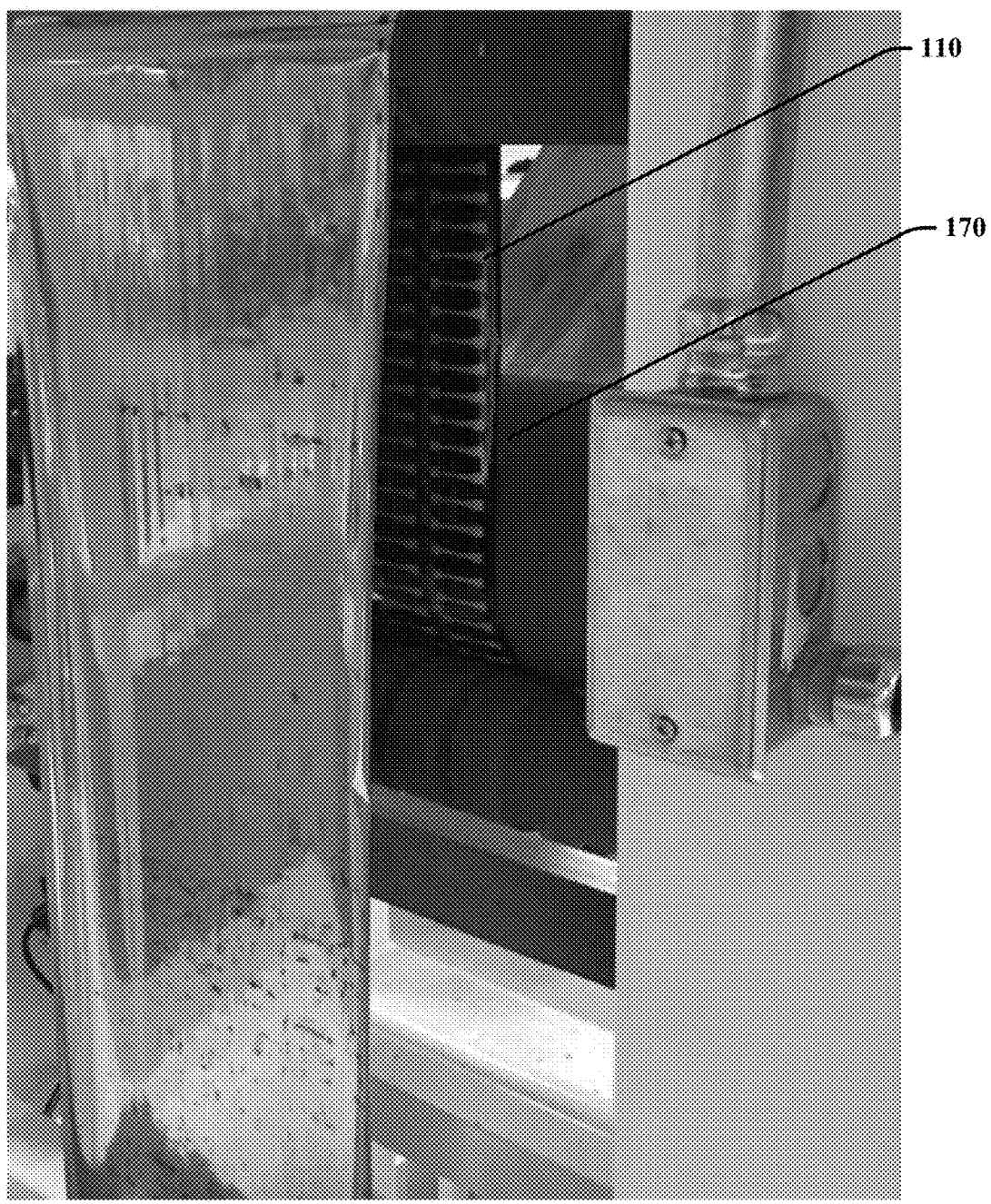
FIG. 20 is a picture of an embodiment of an outfeed nip of the present disclosure.

After being exposed to the first zone Z1 of the oven 160, the solder paste 140 on the substrate 110 may activate the solder flux that may include solvents and have a generally tacky configuration. After passing through the second zone Z2 of the oven 160, the substrate may enter a convection cooling portion 172. As illustrated by FIG. 19, convective cooling portion 172 may be in a third zone Z3 wherein convective cooling may be provided to the substrate 110 during processing after exiting the first zone Z1 and the second zone Z2. The convective cooling portion 172 may alternately be provided in the second zone Z2 if no additional zones are present. The convective cooling portion 172 may be provided along an exit portion of the oven 160 wherein convective heat is provided at a particular temperature and traversed over the substrate 110. Here, any extraneous solvents may be removed from the solder flux wherein the convective cooling portion 172 may further cool or dry the substrate 110 and solder paste 140 as it exists thereon. Upon exiting the oven 160, the solder paste 140 may be dry and non tacky, and the substrate is in condition to be rewound at the rewinding station 180 without interrupting the solder paste configuration.

Additionally, the substrate 110 may also be processed over a conductive cooling portion 174 after the convective cooling portion 172. In one embodiment, the conductive cooling portion 174 may be a chill drum provided along the process direction D of the substrate 110 as it exits the oven 160 before being rewound. Notably, tension of the substrate 110 may be adjusted or isolated between the infeed and outfeed nips 150, 170 or from other independent segmented nips that may be provided along the process direction D.

The formulation of the solder paste 140 may be adjusted to accommodate the shear stress generated by the relatively high processing speeds of the process 100. The specific formulation of the solder paste may be dependent on the deposition method. FIGS. 3 and 4 illustrate various embodiments of the solder paste 40 as it is dispensed and cured along the substrate 10 in a predetermined pattern. As illustrated by FIG. 4, the solder paste 40 may be cured in a pattern that overlaps various electrical traces or conductors on the substrate 10.

Accurately dispensing solder paste in predetermined patterns and providing solder reflow at higher process speeds may be achieved through the use of infrared and/or near infrared heat in combination with convection heat. After exposure to the infrared and/or near infrared, the solder paste converts to a flux that may remain tacky due to the minimal dwell times associated with the process. However, the tacky nature of the flux is undesirable as the substrate 110 may be intended to be processed in roll form. Convection heating may also be provided to assist with reducing the tacky nature of the solder paste flux. Additionally, the solder paste may be treated with various solvents to assist with the drying rate thereof.

While the invention has been described in connection with what is presently considered to be the most practical and preferred embodiment, it will be apparent to those of ordinary skill in the art that the invention is not to be limited to the disclosed embodiment, and that many modifications and equivalent arrangements may be made thereof within the scope of the invention, which scope is to be accorded the broadest interpretation of the appended claims so as to encompass all equivalent structures and products.

Although the embodiments of the present teachings have been illustrated in the accompanying drawings and described in the foregoing detailed description, it is to be understood that the present teachings are not to be limited to just the embodiments disclosed, but that the present teachings described herein are capable of numerous rearrangements, modifications and substitutions without departing from the scope of the claims hereafter. The claims as follows are intended to include all modifications and alterations insofar as they come within the scope of the claims or the equivalent thereof.

The invention claimed is:

1. A system for processing solder paste onto a flexible substrate, comprising:
   a solder paste application station for applying solder paste to a flexible substrate to form a solder paste deposit as the substrate is traveling along a process direction;
   an oven configured to (i) apply infrared heat or electron beam processing to the flexible substrate with the solder paste deposit as the flexible substrate is traveling along the process direction to reflow the solder paste wherein the flexible substrate is traveling along the process direction at a speed that is greater than 30 fpm, and (ii) dry the solder paste as the flexible substrate is traveling along the process direction, wherein the flexible substrate is traveling along the process direction at a speed that is greater than 30 fpm.

2. The system of claim 1, wherein the oven includes a first zone and a second zone such that the temperature within the first zone is independently controlled from the temperature within the second zone.

3. The system of claim 2, wherein the infrared heat is applied within the first zone of the oven and convective heat is applied within the second zone of the oven.

4. The system of claim 2, wherein the oven applies infrared heat and convective heat to the flexible substrate within the first zone of the oven.

5. The system of claim 2, wherein the solder paste is dried in the second zone of the oven.

6. The system of claim 1, wherein the flexible substrate is traveling along the process direction at a speed that is greater than about 50 fpm.

7. The system of claim 6, wherein the flexible substrate is traveling along the process direction at a speed that is greater than about 75 fpm.

8. The system of claim 7, wherein the flexible substrate is traveling along the process direction at a speed that is up to about 100 fpm.

9. The system of claim 1, wherein the flexible substrate is traveling along the process direction at a speed between about 30 fpm and 100 fpm.

* * * * *